(12) United States Patent
Takeuchi et al.

(10) Patent No.: US 7,880,177 B2
(45) Date of Patent: Feb. 1, 2011

(54) SEMICONDUCTOR LIGHT-EMITTING DEVICE, ILLUMINATOR AND METHOD OF MANUFACTURING SEMICONDUCTOR LIGHT-EMITTING DEVICE

(75) Inventors: Kunio Takeuchi, Joyo (JP); Yasumitsu Kunoh, Hirakata (JP)

(73) Assignee: Sanyo Electric Co., Ltd., Osaka (JP)

( * ) Notice: Subject to any disclaimer, the term of this patent is extended or adjusted under 35 U.S.C. 154(b) by 310 days.

(21) Appl. No.: 12/090,181

(22) PCT Filed: Oct. 12, 2007

(86) PCT No.: PCT/JP2007/069968
§ 371 (c)(1),
(2), (4) Date: Apr. 14, 2008

(87) PCT Pub. No.: WO2008/044769
PCT Pub. Date: Apr. 17, 2008

(65) Prior Publication Data
US 2009/0173952 A1    Jul. 9, 2009

(30) Foreign Application Priority Data
Oct. 13, 2006  (JP)  .............................. 2006-280409
Oct. 12, 2007  (JP)  .............................. 2007-266058

(51) Int. Cl.
*H01L 33/00* (2010.01)
(52) U.S. Cl. .................... 257/79; 438/26; 257/E33.055

(58) Field of Classification Search ................... 257/79, 257/E33.055; 438/26
See application file for complete search history.

(56) References Cited

U.S. PATENT DOCUMENTS

| 7,105,857 B2 | 9/2006 | Nagahama et al. |
| 2004/0061433 A1 | 4/2004 | Izuno et al. |

(Continued)

FOREIGN PATENT DOCUMENTS

JP    7-273401 A    10/1995

(Continued)

OTHER PUBLICATIONS

International Search Report mailed on Nov. 13, 2007 in PCT/JP2007/069968.

(Continued)

*Primary Examiner*—Thao X Le
*Assistant Examiner*—Tanika Warrior
(74) *Attorney, Agent, or Firm*—Ditthavong Mori & Steiner, P.C.

(57) ABSTRACT

A semiconductor light-emitting device having high reliability is obtained while suppressing separation between a support substrate and a semiconductor element layer. This semiconductor light-emitting device includes a support substrate (1), a first bonding layer (2a) formed on the support substrate (1), a second bonding layer (2b) formed on the first bonding layer (2a), a third bonding layer (2c) formed on the second bonding layer (2b), and a semiconductor element layer (3) formed on the third bonding layer (2c). The melting point of the second bonding layer (2b) is lower than the melting points of the first bonding layer (2a) and the third bonding layer (2c).

16 Claims, 10 Drawing Sheets

U.S. PATENT DOCUMENTS

| | | |
|---|---|---|
| 2004/0104395 A1 | 6/2004 | Hagimoto et al. |
| 2006/0006398 A1 | 1/2006 | Hata |
| 2006/0097354 A1 | 5/2006 | Ogihara et al. |
| 2006/0128118 A1 | 6/2006 | Nagahama et al. |
| 2008/0164488 A1* | 7/2008 | Ikeda et al. ............ 257/99 |

FOREIGN PATENT DOCUMENTS

| | | |
|---|---|---|
| JP | 2001-339100 A | 12/2001 |
| JP | 2004-235506 A | 8/2004 |
| JP | 2004-266240 A | 9/2004 |
| JP | 2005-108519 A | 4/2005 |
| JP | 2006-049871 A | 2/2006 |
| JP | 2006-140186 A | 6/2006 |
| JP | 2006-210829 A | 8/2006 |
| JP | 2006-278463 A | 10/2006 |
| WO | WO 2005/091388 A1 | 9/2005 |

OTHER PUBLICATIONS

Written Opinion mailed on Nov. 13, 2007 in PCT/JP2007/069968.
Chinese Office Action for corresponding CN Application No. 200780001749.6, dated Jun. 29, 2010, pp. 1-8 China.

* cited by examiner

US 7,880,177 B2

SEMICONDUCTOR LIGHT-EMITTING DEVICE, ILLUMINATOR AND METHOD OF MANUFACTURING SEMICONDUCTOR LIGHT-EMITTING DEVICE

TECHNICAL FIELD

The present invention relates to a semiconductor light-emitting device, an illuminator and a method of manufacturing a semiconductor light-emitting device, and more particularly, it relates to a semiconductor light-emitting device in which a semiconductor element layer including an emission layer is bonded onto a support substrate, an illuminator and a method of manufacturing a semiconductor light-emitting device.

BACKGROUND ART

A semiconductor light-emitting device in which a semiconductor element layer including an emission layer is bonded onto a support substrate is known in general. Such semiconductor light-emitting devices are disclosed in Japanese Patent Laying-Open No. 2006-49871 and Japanese Patent Laying-Open No. 2004-235506, for example. These semiconductor light-emitting devices are formed by forming high-quality semiconductor element layers on growth substrates and thereafter bonding the semiconductor element layers onto support substrates different from the growth substrates. The growth substrates can be recycled by removing the growth substrates from the semiconductor element layers after this bonding.

FIG. 18 is a sectional view for illustrating the structure of a conventional light-emitting diode device. The structure of the conventional light-emitting diode device is described with reference to FIG. 16.

In the conventional light-emitting diode device, a GaN-based semiconductor element layer 103 is formed on a support substrate 101 of Si through a bonding layer 102, as shown in FIG. 18. The semiconductor element layer 103 is constituted of a p-type GaN-based semiconductor layer 103a, an active layer 103d and an n-type GaN-based semiconductor layer 103f.

As a specific structure, the p-type GaN-based semiconductor layer 103a has a thickness of about 200 nm. The active layer 103d having a thickness of about 50 nm and having an MQW (Multiple Quantum Well) structure in which well layers and barrier layers are alternately formed is formed on the p-type GaN-based semiconductor layer 103a. The n-type GaN-based semiconductor layer 103f having a thickness of about 7 μm is formed on the active layer 103d.

A p-side electrode 105 consisting of a multilayer film of a Pd layer having a thickness of about 3 nm and an Ag layer having a thickness of about 150 nm is formed on the lower surface of the p-type GaN-based semiconductor layer 103a. A barrier layer 106 of Mo having a thickness of about 50 nm is formed on the lower surface of the p-side electrode 105.

An n-side electrode 107 consisting of a multilayer film of a Ti layer having a thickness of about 15 nm and an Al layer having a thickness of about 150 nm from the side of the semiconductor element layer 103 is formed on the upper surface of the semiconductor element layer 103.

An ohmic layer 101a in which a Ti layer having a thickness of about 15 nm and an Al layer having a thickness of about 150 nm are formed in this order is formed on the upper surface of the support substrate 101.

The bonding layer 102 formed between the ohmic layer 101a and the barrier layer 106 is constituted of a first bonding layer 102a of Au having a thickness of about 3 μm formed on the ohmic layer 101a, a second bonding layer 102b of an Au—Sn alloy (Sn content: about 20 mass %) having a thickness of about 3 μm formed on the first bonding layer 102a and a third bonding layer 102c of Au having a thickness of about 100 nm formed on the second bonding layer 102b.

FIGS. 19 to 21 are sectional views for illustrating a manufacturing process for the conventional light-emitting diode device shown in FIG. 18. The manufacturing process for the conventional light-emitting diode device is now described with reference to FIGS. 18 to 21.

First, a buffer layer 109 of a GaN-based semiconductor having a thickness of about 20 nm is formed on a growth substrate 108 of sapphire by MOCVD (Metal Organic Chemical Vapor deposition), as shown in FIG. 19. Then, the n-type GaN-based semiconductor layer 103f, the active layer 103d and the p-type GaN-based semiconductor layer 103a having the aforementioned thicknesses are formed in this order on the buffer layer 109 by MOCVD. Then, the p-side electrode 105 is formed by forming the Pd layer and the Ag layer having the aforementioned thicknesses respectively in this order on the p-type GaN-based semiconductor layer 103 by electron beam evaporation (EB). Further, the barrier layer 106 of Mo having the thickness of about 50 nm is formed on the p-side electrode 105 by EB.

Then, as shown in FIG. 19, the third bonding layer 102c and the second bonding layer 102b having the aforementioned thicknesses and compositions respectively are formed in this order on the barrier layer 106 by EB.

Then, the ohmic layer 101a is formed by forming the Ti layer and the Al layer having the aforementioned thicknesses respectively in this order on the support substrate 101 by EB, as shown in FIG. 20. Further, the first bonding layer 102a of Au having the thickness of about 3 μm is formed on the ohmic layer 101a by EB.

Then, the growth substrate 108 is arranged on the support substrate 101 so that the first bonding layer 102a and the second bonding layer 102b are in contact with each other, as shown in FIG. 21. Then, the support substrate 101 and the growth substrate 108 are heated/compression-bonded under conditions of about 290° C. and about 200 N/cm², whereby the first bonding layer 102a and the second bonding layer 102b are bonded to each other. Thereafter a YAG third harmonic laser (wavelength: 355 nm) is applied from the side of the growth substrate 108 toward the buffer layer 109 as shown by arrows in the figure, thereby thermally decomposing parts of the growth substrate 108, the buffer layer 109 and the n-type GaN-based semiconductor layer 103f and removing the growth substrate 108 and the buffer layer 109.

Then, the upper surface of the n-type GaN-based semiconductor layer 103f is polished for removing the buffer layer 109 etc. remaining on the surface, and the n-side electrode 107 is thereafter formed by forming the Ti layer and the Al layer having the aforementioned thicknesses respectively in this order on the n-type GaN-based semiconductor layer 103f, as shown in FIG. 18. Finally, scribing lines are formed on the lower surface (surface to which the semiconductor element layer 103 is not bonded) of the support substrate 101 by dicing, and the support substrate 101 is divided into every semiconductor element layer 103 bonded to the support substrate 101 along these scribing lines. Thus, the conventional light-emitting diode device is formed.

Also in the aforementioned conventional light-emitting diode device, however, bonding strength between the support substrate 101 and the semiconductor element layer 103 is not sufficient. Therefore, there is such a problem that separation may be caused between the support substrate 101 and the bonding layer 102 or between the bonding layer 102 and the semiconductor element layer 103 when the growth substrate 108 is removed, for example. In the conventional light-emitting diode device, further, the semiconductor element layer 103 or the p-side electrode 105 close to the joint surface may be cracked or separated due to a load resulting from heating in bonding. In this case, the operating voltage of the light-emitting diode device may increase or the light-emitting device may emit no light due to non-flowing of an operating current, whereby there is such a problem that reliability of the light-emitting diode device lowers.

DISCLOSURE OF THE INVENTION

The present invention has been proposed in order to solve the aforementioned problems, and an object of the present invention is to provide a semiconductor light-emitting device and an illuminator having high reliability while suppressing separation between a support substrate and a semiconductor element layer.

Another object of the present invention is to provide a method of manufacturing a semiconductor light-emitting device having high reliability while suppressing separation between a support substrate and a semiconductor element layer.

A semiconductor light-emitting device according to a first aspect of the present invention comprises a support substrate, a first eutectic alloy layer formed on the support substrate, a second eutectic alloy layer formed on the first eutectic alloy layer, a third eutectic alloy layer formed on the second eutectic alloy layer and a semiconductor element layer including an emission layer formed on the third eutectic alloy layer, while the melting point of the second eutectic alloy layer is lower than the melting points of the first and third eutectic alloy layers. In the present invention, "semiconductor light-emitting device" is a wide concept including a light-emitting diode device or a semiconductor laser device, for example. In the present invention, further, "eutectic alloy" means an alloy of a low melting point having such a eutectic structure that a plurality of metals such as solder, for example, are solidly dissolved into each other.

In the semiconductor light-emitting device according to the first aspect of the present invention, as hereinabove described, the semiconductor element layer and the support substrate are bonded to each other through the eutectic alloy of a low melting point, whereby bonding at a low temperature is workable. Further, the first eutectic alloy layer and the third eutectic alloy layer having relatively high melting points are provided on the side of the support substrate and on the side of the semiconductor element layer and the second eutectic alloy layer having a relatively low melting point is provided between the first eutectic alloy layer and the third eutectic alloy layer, whereby the support substrate and the semiconductor element layer can be bonded to each other in a state where the second eutectic alloy layer is molten while the first eutectic alloy layer and the third eutectic alloy layer are not molten but softened. Thus, thermal stress caused between the support substrate, the semiconductor element layer, the first eutectic alloy layer, the second eutectic alloy layer and the third eutectic alloy layer can be relaxed.

Even when a clearance resulting from a corrugated shape is present between the support substrate and the semiconductor element layer, the softened first and third eutectic alloy layers and the molten second eutectic alloy layer are easily embedded in the corrugated shape portion in the first aspect, whereby the bonding area can be increased. Thus, bonding strength can be improved, whereby separation between the support substrate and the semiconductor element can be suppressed. Further, the bonding area can be so increased that heat radiation in laser application can be homogeneously and efficiently performed.

Consequently, the semiconductor element layer can be prevented from a damage resulting from a load caused by thermal stress or the like, whereby occurrence of such a problem that an operating voltage increases due to the damage or the device emits no light due to non-flowing of an operating current can be suppressed. Thus, a semiconductor light-emitting device having high reliability can be obtained.

In the aforementioned semiconductor light-emitting device according to the first aspect, the third eutectic alloy layer is preferably formed on the side surface of the semiconductor element layer through an insulating layer. According to this structure, the third eutectic alloy layer can be formed on the side surface of the semiconductor element layer while inhibiting a current fed to the semiconductor element layer from leaking to the third eutectic alloy layer formed on the side surface of the semiconductor element layer. Thus, heat can be released from the side surface of the semiconductor element layer by providing the third eutectic alloy layer also on the side surface of the semiconductor layer, dissimilarly to a case where the third eutectic alloy layer is not provided on the side surface of the semiconductor element layer. Thus, thermal stress caused between the support substrate, the semiconductor element layer, the first eutectic alloy layer, the second eutectic alloy layer and the third eutectic alloy layer can be efficiently relaxed.

In the aforementioned semiconductor light-emitting device according to the first aspect, the thermal expansion coefficient of the second eutectic alloy layer is preferably larger than the thermal expansion coefficients of the first eutectic alloy layer and the third eutectic alloy layer. According to this structure, the second eutectic alloy layer having the large thermal expansion coefficient can be inhibited from deformation from both sides by the first eutectic alloy layer and the third eutectic alloy layer having small thermal expansion coefficients provided on both sides of the second eutectic alloy layer. Thus, influence by thermal stress caused between the support substrate, the semiconductor element layer, the first eutectic alloy layer, the second eutectic alloy layer and the third eutectic alloy layer can be further relaxed.

In the aforementioned semiconductor light-emitting device according to the first aspect, the first eutectic alloy layer, the second eutectic alloy layer and the third eutectic alloy layer preferably contain at least any of an Au—Sn alloy, an Au—Ge alloy and an Au—Si alloy respectively. According to this structure, the support substrate and the semiconductor element layer can be bonded to each other by heating the same to a relatively low temperature with the Au—Sn alloy, the Au—Ge alloy or the Au—Si alloy having a low melting point.

In the aforementioned structure having the first eutectic alloy layer, the second eutectic alloy layer and the third eutectic alloy layer containing at least any of the Au—Sn alloy, the Au—Ge alloy and the Au—Si alloy respectively, the first eutectic alloy layer, the second eutectic alloy layer and the third eutectic alloy layer preferably consist of the Au—Sn alloy, and the content of Sn in the second eutectic alloy layer is preferably larger than the contents of Sn in the first eutectic alloy layer and the third eutectic alloy layer. According to this structure, the melting point of the second eutectic alloy layer can be easily rendered lower than the melting points of the first and third eutectic alloy layers.

In the aforementioned structure having the first eutectic alloy layer, the second eutectic alloy layer and the third eutectic alloy layer containing at least any of the Au—Sn alloy, the Au—Ge alloy and the Au—Si alloy respectively, the first eutectic alloy layer and the third eutectic alloy layer preferably consist of the Au—Ge alloy, and the second eutectic alloy layer preferably consists of the Au—Sn alloy. According to this structure, the bonding strength between the support substrate and the semiconductor element layer can be improved as compared with a case of preparing the first eutectic alloy layer and the third eutectic alloy layer from the Au—Sn alloy. This effect has already been demonstrated by an experiment described later.

An illuminator according to a second aspect of the present invention comprises a semiconductor light-emitting device including a support substrate, a first eutectic alloy layer formed on the support substrate, a second eutectic alloy layer formed on the first eutectic alloy layer, a third eutectic alloy layer formed on the second eutectic alloy layer and a semiconductor element layer including an emission layer formed on the third eutectic alloy layer, while the melting point of the second eutectic alloy layer is lower than the melting points of the first eutectic alloy layer and the third eutectic alloy layer.

As hereinabove described, the illuminator according to the second aspect of the present invention is provided with the aforementioned semiconductor light-emitting device according to the first aspect, whereby illumination can be performed by making the aforementioned semiconductor light-emitting device having a low operating voltage emit light. Thus, an illuminator having small power consumption and high energy efficiency can be obtained.

A method of manufacturing a semiconductor light-emitting device according to a third aspect of the present invention comprises steps of forming a semiconductor element layer including an emission layer, arranging, between a support substrate and the semiconductor element layer, a first eutectic alloy layer, a second eutectic alloy layer and a third eutectic alloy layer in this order from the side of the support substrate, and bonding the semiconductor element layer and the said support substrate to each other through the first eutectic alloy layer, the second eutectic alloy layer and the third eutectic alloy layer by heating the same, while the melting point of the second eutectic alloy layer is lower than the melting points of the first eutectic alloy layer and the third eutectic alloy layer, and a heating temperature in the step of bonding the semiconductor element layer and the support substrate to each other is at least the melting point of the second eutectic alloy layer and less than the melting points of the first eutectic alloy layer and the third eutectic alloy layer.

In the method of manufacturing a semiconductor light-emitting device according to the third aspect of the present invention, as hereinabove described, the support substrate and the semiconductor element layer can be bonded to each other in a state where the second eutectic alloy layer is molten while the first eutectic alloy layer and the third eutectic alloy layer are not molten but softened by heating the same to the temperature of at least the melting point of the second eutectic alloy layer and less than the melting points of the first eutectic alloy layer and the third eutectic alloy layer. Thus, bonding at a relatively low temperature is workable, whereby thermal stress caused between the support substrate, the semiconductor element layer, the first eutectic alloy layer, the second eutectic alloy layer and the third eutectic alloy layer can be relaxed. Even when a clearance resulting from a corrugated shape is present between the support substrate and the semiconductor element layer, the softened first and third eutectic alloy layers and the molten second eutectic alloy layer are easily embedded in the corrugated shape portion, whereby the bonding area can be increased. Thus, bonding strength can be improved, whereby separation between the support substrate and the semiconductor element layer can be suppressed. Further, the bonding area can be so increased that heat radiation in laser application can be homogeneously and efficiently performed. Consequently, the semiconductor element layer can be prevented from a damage resulting from a load caused by thermal stress or the like, whereby occurrence of such a problem that an operating voltage increases due to the damage or the device emits no light due to non-flowing of an operating current can be suppressed. Thus, a semiconductor light-emitting device having high reliability can be obtained.

In the aforementioned method of manufacturing a semiconductor light-emitting device according to the third aspect, the step of arranging the first eutectic alloy layer, the second eutectic alloy layer and the third eutectic alloy layer preferably includes steps of forming the third eutectic alloy layer, the second eutectic alloy layer and the first eutectic alloy layer in this order on the semiconductor element layer, and arranging the support substrate on the first eutectic alloy layer. According to this structure, the support substrate and the semiconductor element can be easily bonded to each other by forming the third eutectic alloy layer, the second eutectic alloy layer and the first eutectic alloy layer in this order on the semiconductor element layer and thereafter heating the support substrate and the semiconductor element layer in the state arranging the support substrate on the first eutectic alloy layer.

In the aforementioned method of manufacturing a semiconductor light-emitting device according to the third aspect, the step of arranging the first eutectic alloy layer, the second eutectic alloy layer and the third eutectic alloy layer preferably includes steps of forming the third eutectic alloy layer, the second eutectic alloy layer and a part of the first eutectic alloy layer in this order on the semiconductor element layer, forming another part of the first eutectic alloy layer on the support substrate, and arranging the part of the first eutectic alloy layer formed on the support substrate on the part of the first eutectic alloy layer formed on the semiconductor element layer. According to this structure, the support substrate and the semiconductor element layer can be easily bonded to each other by forming the third eutectic alloy layer, the second eutectic alloy layer and the part of the first eutectic alloy layer in this order on the semiconductor element layer, forming the part of the first eutectic alloy layer on the substrate and thereafter heating the support substrate and the semiconductor element layer in the state arranging the part of the first eutectic alloy layer formed on the support substrate on the part of the first eutectic alloy layer formed on the semiconductor element layer.

In the aforementioned method of manufacturing a semiconductor light-emitting device according to the third aspect, the step of arranging the first eutectic alloy layer, the second eutectic alloy layer and the third eutectic alloy layer preferably includes a step of forming the third eutectic alloy layer on the side surface of the semiconductor element layer through an insulating layer. According to this structure, the third eutectic alloy layer can be formed on the side surface of the semiconductor element layer without leaking a current fed to the semiconductor element layer to the third eutectic alloy layer formed on the side surface of the semiconductor element layer. Thus, heat can be released from the side surface of the semiconductor element layer by providing the third eutectic alloy layer also on the side surface of the semiconductor element layer, dissimilarly to a case where the third eutectic alloy layer is not provided on the side surface of the semiconductor element layer. Thus, thermal stress caused between the support substrate, the semiconductor element layer, the first eutectic alloy layer, the second eutectic alloy layer and the third eutectic alloy layer can be efficiently relaxed.

In the aforementioned method of manufacturing a semiconductor light-emitting device according to the third aspect, the step of forming the semiconductor element layer preferably includes a step of forming the semiconductor element layer on a growth substrate, and the method preferably further comprises a step of removing the growth substrate from the semiconductor element layer. According to this structure, the semiconductor light-emitting device can be downsized and reduced in thickness by bonding the semiconductor element layer formed on the growth substrate and the support substrate to each other and thereafter removing the growth substrate from the semiconductor element layer. Further, the semiconductor light-emitting device can be formed by recycling the same growth substrate.

BEST MODES FOR CARRYING OUT THE INVENTION

Embodiments of the present invention are now described with reference to the drawings.

First Embodiment

The structure of a light-emitting diode device according to a first embodiment of the present invention is described with reference to FIG. 1.

Figure 1:
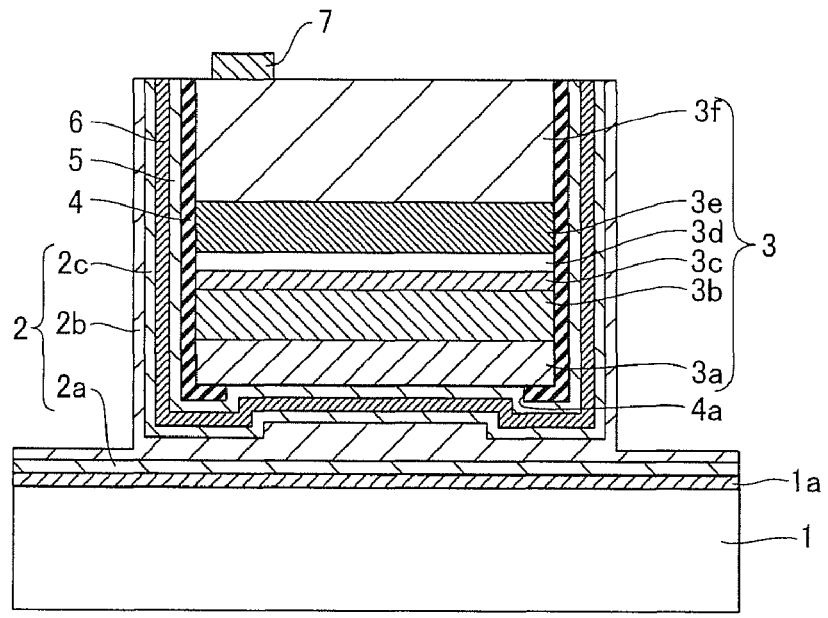
FIG. 1 A sectional view for illustrating the structure of a light-emitting diode device according to a first embodiment of the present invention.

In the light-emitting diode device according to the first embodiment of the present invention, a GaN-based semiconductor element layer 3 is formed on a support substrate 1 of p-type Ge having a thickness of about 350 μm through a bonding layer 2, as shown in FIG. 1. The semiconductor element layer 3 is constituted of a p-type contact layer 3a, a p-type clad layer 3b, a p-type cap layer 3c, an active layer 3d, an n-type clad layer 3e and an n-type contact layer 3f. The active layer 3d is an example of the "emission layer" in the present invention.

As a specific structure, the p-type contact layer 3a consists of Mg-doped $Ga_{0.95}In_{0.05}N$ having a thickness of about 5 nm. The p-type clad layer 3b of Mg-doped $Al_{0.1}Ga_{0.9}N$ having a thickness of about 100 nm is formed on the p-type contact layer 3a. The p-type cap layer 3c of Mg-doped $Al_{0.1}Ga_{0.9}N$ having a thickness of about 20 nm is formed on the p-type clad layer 3b.

The active layer 3d formed on the p-type cap layer 3c has an MQW structure in which three well layers of undoped $Ga_{0.9}In_{0.1}N$ having a thickness of about 5 nm and four barrier layers of undoped GaN having a thickness of about 10 nm are alternately formed. The n-type clad layer 3e of Si-doped $Al_{0.1}Ga_{0.9}N$ having a thickness of about 150 nm is formed on the active layer 3d. The n-type contact layer 3f of Si-doped $Ga_{0.95}In_{0.05}N$ having a thickness of about 4 μm is formed on the n-type clad layer 3e.

An insulating layer 4 of $SiO_2$ having a thickness of about 500 nm is formed on the side surface of the semiconductor element layer 3 on which the respective layers 3a and 3f are exposed. The insulating layer 4 extends toward the lower surface of the semiconductor element layer 3, and the p-type contact layer 3a is exposed from an opening 4a of the insulating layer 4. Further, a p-side electrode 5 and a barrier layer 6 are formed in this order on the side surface and the lower surface of the semiconductor element layer 3, to cover the insulating layer 4. In the p-side electrode 5, a Pd layer having a thickness of about 3 nm and an Ag layer having a thickness of about 150 nm are stacked in this order from the side of the insulating layer 4 and the p-type contact layer 3a. In the barrier layer 6, a Ti layer having a thickness of about 30 nm, a Pd layer having a thickness of about 100 nm and an Au layer having a thickness of about 300 nm are stacked in this order from the side of the p-side electrode 5.

An n-side electrode 7 in which an Al layer having a thickness of about 6 nm, a Pd layer having a thickness of about 10 nm and an Au layer having a thickness of about 300 nm are stacked in this order from the side of the semiconductor element layer 3 is formed on the upper surface of the semiconductor element layer 3.

An ohmic layer 1a in which an Ni layer having a thickness of about 150 nm and an Au layer having a thickness of about 100 nm are formed in this order is formed on the upper surface of the support substrate 1.

The bonding layer 2 formed between the ohmic layer 1a and the barrier layer 6 is constituted of a first bonding layer 2a of an Au—Sn alloy (Sn content: about 20 mass %, melting point: about 278° C., thermal expansion coefficient: about $17.5 \times 10^{-6}$/K) (hereinafter referred to as Au—Sn20) having a thickness of about 1 μm formed on the ohmic layer 1a, a second bonding layer 2b of another Au—Sn alloy (Sn content: about 90 mass %, melting point: about 217° C., thermal expansion coefficient: about $13.6 \times 10^{-6}$/K) (hereinafter referred to as Au—Sn90) having a thickness of about 3 μm formed on the first bonding layer 2a and a third bonding layer 2c of Au—Sn20 having a thickness of about 1 μm formed on the second bonding layer 2b. The first bonding layer 2a, the second bonding layer 2b and the third bonding layer 2c are examples of the "first eutectic alloy layer", the "second eutectic alloy layer" and the "third eutectic alloy layer" in the present invention respectively. The third bonding layer 2c and the second bonding layer 2b are stacked in this order also on the side surface of the semiconductor element layer 3 through the insulating layer 4, the p-side electrode 5 and the barrier layer 6.

A manufacturing process for the light-emitting diode device according to the first embodiment of the present invention is now described with reference to FIGS. 1 to 8.

Figure 2:
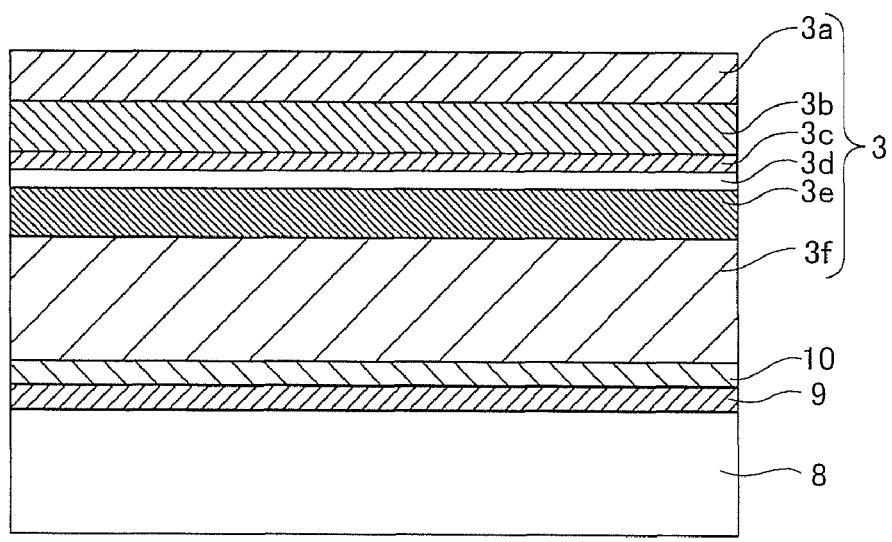
FIG. 2 A sectional view for illustrating a manufacturing process for the light-emitting diode device according to the first embodiment.

First, as shown in FIG. 2, a buffer layer 9 of GaN having a thickness of about 50 nm and a separation layer 10 of $Ga_{0.7}In_{0.3}N$ having a thickness of about 20 nm are formed in this order on a growth substrate 8 of GaN having a thickness of about 400 μm by MOCVD under conditions shown in the following Table 1. Then, the respective layers 3a to 3f of the semiconductor element layer 3 having the aforementioned thicknesses and compositions respectively are formed on the separation layer 10 by MOCVD under conditions shown in Table 1. Formation of the respective layers 3a to 3f is performed in order of the n-type contact layer 3f, the n-type clad layer 3e, the active layer 3d, the p-type cap layer 3c, the p-type clad layer 3b and the p-type contact layer 3a.

TABLE 1

|  | Growth Temperature (° C.) | Source Gas | Dopant |
|---|---|---|---|
| Buffer Layer | 450 | $NH_3$, TMGa | no |
| Separation Layer | 750 | $NH_3$, TMGa, TMIn | no |
| n-Type Contact Layer | 1150 | $NH_3$, TMGa, TMIn | $SiH_4$ |
| n-Type Clad Layer | 1150 | $NH_3$, TMGa, TMAl | $SiH_4$ |
| Active Layer |  |  |  |
| Well Layer | 850 | $NH_3$, TMGa, TMIn | no |
| Barrier Layer | 850 | $NH_3$, TMGa | no |
| p-Type Cap Layer | 1150 | $NH_3$, TMGa, TMAl | $CP_2Mg$ |
| p-Type Clad Layer | 1150 | $NH_3$, TMGa, TMAl | $CP_2Mg$ |
| p-Type Contact Layer | 850 | $NH_3$, TMGa, TMIn | $CP_2Mg$ |

Figure 3:
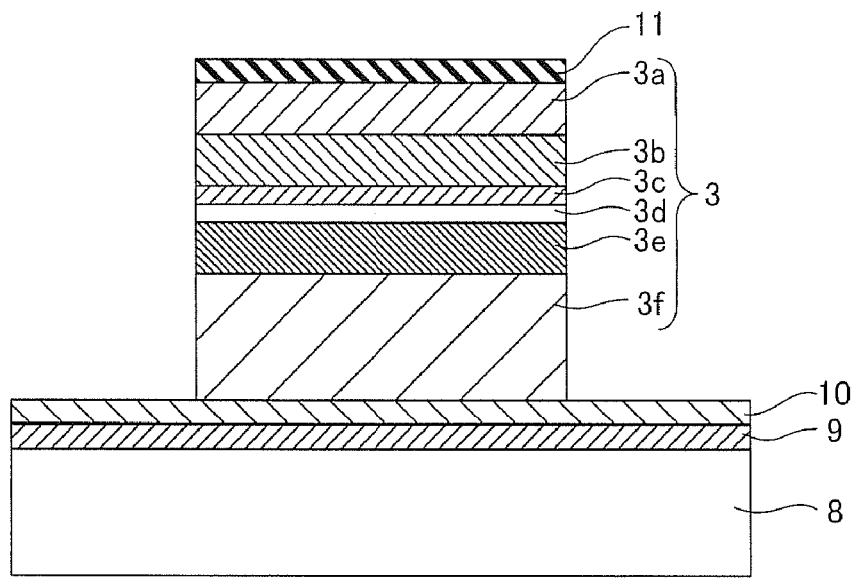
FIG. 3 A sectional view for illustrating the manufacturing process for the light-emitting diode device according to the first embodiment.

Then, a mask layer 11 of $SiO_2$ having a thickness of about 600 nm is formed on the p-type contact layer 3a of a region for forming the light-emitting diode device and the regions exposed from the mask layer 11 are thereafter etched up to the n-type contact layer 3f, as shown in FIG. 3. Thus, the separation layer 10 is exposed around the region for forming the light-emitting diode device, while the side surfaces of the respective layers 3a to 3f corresponding to the side surface of the semiconductor element layer 3 are exposed. Thereafter the mask layer 11 is removed.

Figure 4:
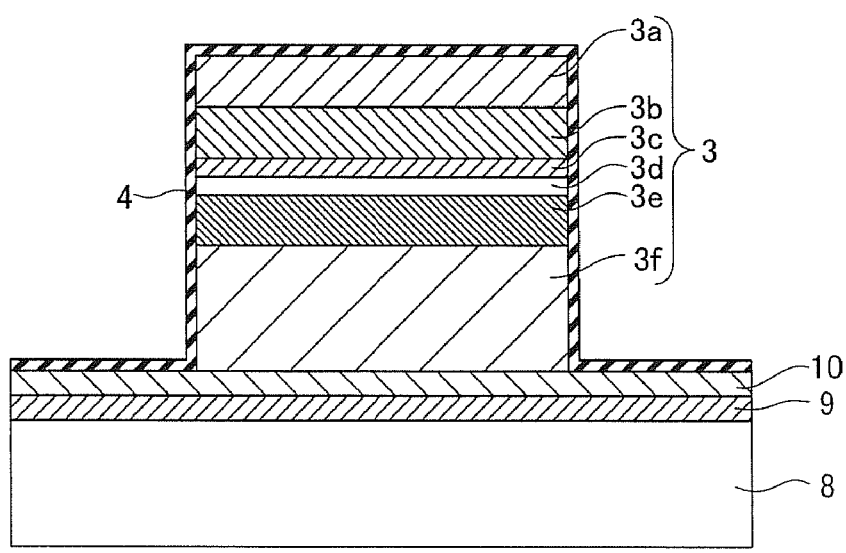
FIG. 4 A sectional view for illustrating the manufacturing process for the light-emitting diode device according to the first embodiment.

Then, the insulating layer 4 of $SiO_2$ having the thickness of about 500 nm is formed on the upper surface of the separation layer 10 and the upper surface and the side surface of the semiconductor element layer 3, as shown in FIG. 4.

Figure 5:
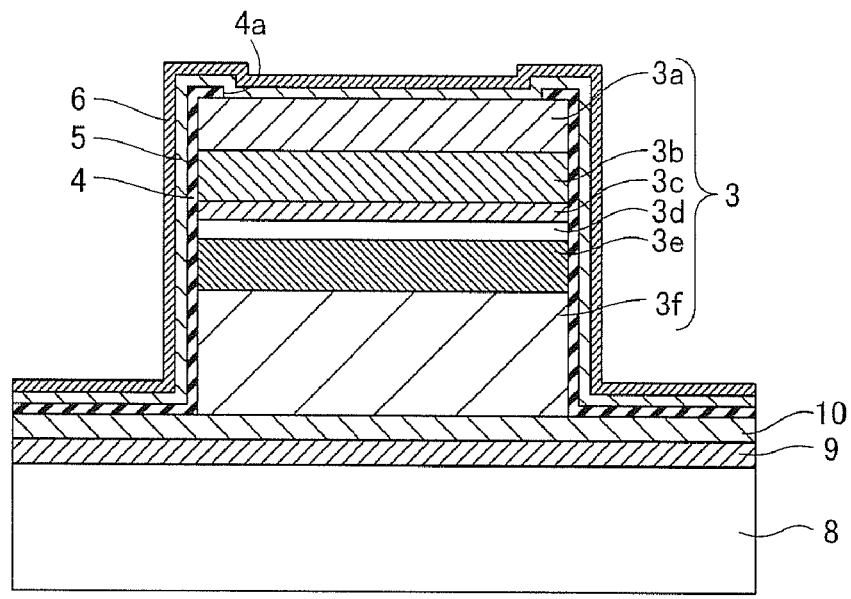
FIG. 5 A sectional view for illustrating the manufacturing process for the light-emitting diode device according to the first embodiment.

Then, the opening 4a is formed in the insulating layer 4 located at the center of the upper surface of the p-type contact layer 3a by photolithography, thereby exposing the p-type contact layer 3a, as shown in FIG. 5. Then, the Pd layer and the Ag layer having the aforementioned thicknesses respectively are formed in this order on the upper surface and the side surface of the insulating layer 4 and on the upper surface of the p-type contact layer 3a in the opening 4a by vacuum evaporation, thereby forming the p-side electrode 5. Further, the Ti layer, the Pd layer and the Au layer having the aforementioned thicknesses respectively are formed in this order on the upper surface and the side surface of the p-side electrode 5 by vacuum evaporation, thereby forming the barrier layer 6.

Figure 6:
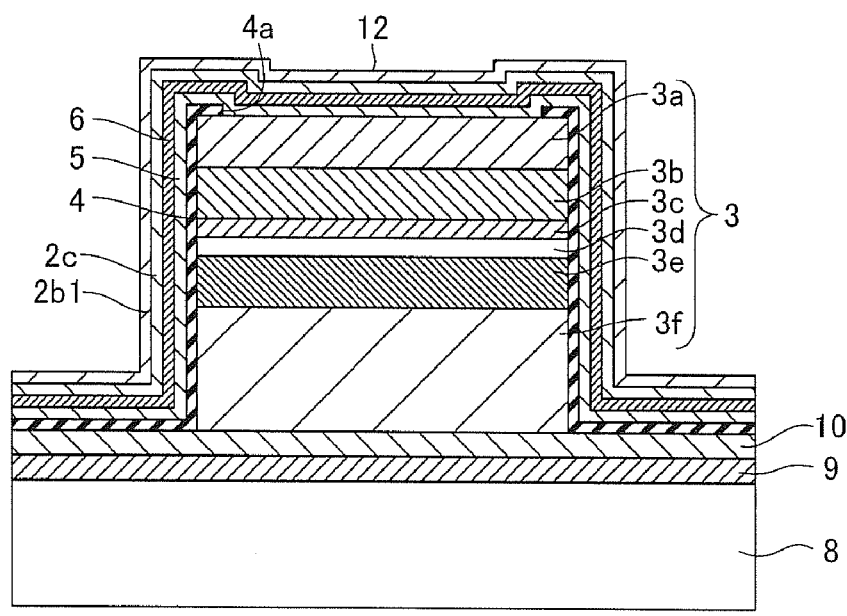
FIG. 6 A sectional view for illustrating the manufacturing process for the light-emitting diode device according to the first embodiment.

Then, the third bonding layer 2c of Au—Sn20 having the thickness of about 1 μm is formed on the upper surface and the side surface of the barrier layer 6 by vacuum evaporation, as shown in FIG. 6. Further, a fourth bonding layer 2b1 of Au—Sn90 having a thickness of about 1.5 μm is formed on the upper surface and the side surface of the third bonding layer 2c. A recess portion 12 is formed on the upper surface of the fourth bonding layer 2b1, due to a step of the opening 4a.

Figure 7:
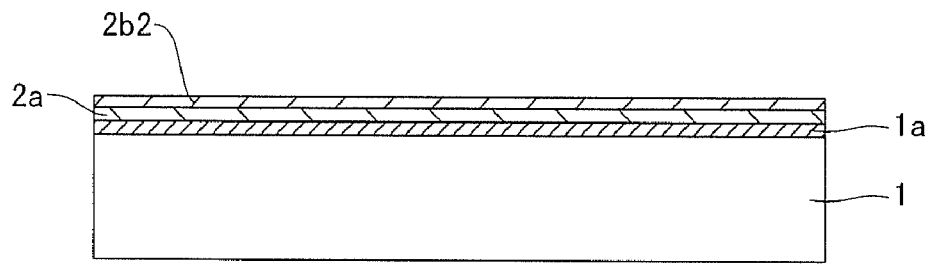
FIG. 7 A sectional view for illustrating the manufacturing process for the light-emitting diode device according to the first embodiment.

Then, the Ni layer and the Au layer having the aforementioned thicknesses respectively are formed in this order on the support substrate 1 by vacuum evaporation, thereby forming the ohmic layer 1a, as shown in FIG. 7. Further, the first bonding layer 2a having the aforementioned thickness and composition respectively and a fifth bonding layer 2b2 of Au—Sn90 having a thickness of about 1.5 μm are formed in this order on the ohmic layer 1a by vacuum evaporation. In addition, an Au layer (not shown) having a thickness of about 10 nm is formed on the fourth bonding layer 2b2, for the purpose of preventing oxidation.

Figure 8:
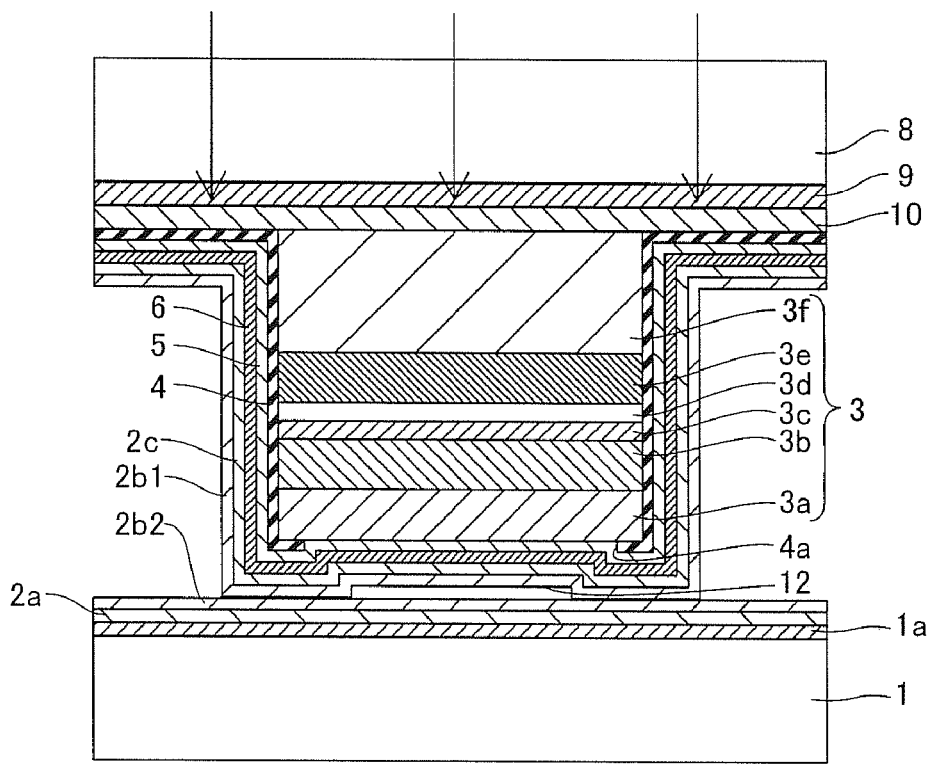
FIG. 8 A sectional view for illustrating the manufacturing process for the light-emitting diode device according to the first embodiment.

Then, the growth substrate 8 is arranged on the support substrate 1 to oppose the fourth bonding layer 2b1 and the fifth bonding layer 2b2 to each other, as shown in FIG. 8. At this time, a clearance is formed between the fourth bonding layer 2b1 and the fifth bonding layer 2b2, due to the recess portion 12 on the upper surface of the fourth bonding layer 2b1. Then, the support substrate 1 and the growth substrate 8 are heated/compression-bonded for about 15 minutes under conditions of about 255° C. and about 100 N/cm². Thus, the fourth bonding layer 2b1 and the fifth bonding layer 2b2 are molten and integrated with each other thereby forming the second bonding layer 2b, and the growth substrate 8 and the support substrate 1 are bonded to each other. The Au layer (not shown) for preventing oxidation having been formed on the fourth bonding layer 2b1 is incorporated into the second bonding layer 2b following the aforementioned melting. Further, the first bonding layer 2a and the third bonding layer 2c are also softened and deformed by the aforementioned heating/compression bonding, whereby the bonding layer 2 consisting of the first bonding layer 2a, the second bonding layer 2b and the third bonding layer 2c is filled into the clearance formed by the recess portion 12. Thereafter a YAG second harmonic laser (wavelength: 532 nm) is applied from the side of the growth substrate 8 toward the separation layer 10 as shown by arrows in the figure, whereby thermal decomposition of the separation layer 10 is prompted, and the growth substrate 8, the buffer layer 9 and the separation layer 10 are removed.

Then, the upper surface of the n-type contact layer 3f is polished for removing the separation layer 10 etc. remaining on the surface, and the Al layer, the Pd layer and the Au layer having the aforementioned thicknesses respectively are thereafter formed in this order on the n-type contact layer 3f, thereby forming the n-side electrode 7, as shown in FIG. 1. Finally, scribing lines are formed on the lower surface (surface to which the semiconductor element layer 3 is not bonded) by dicing, and the support substrate 1 is divided into every semiconductor element layer 3 bonded to the support substrate 1 along the scribing lines. Thus, the light-emitting diode device according to the first embodiment of the present invention is formed.

According to the first embodiment, as hereinabove described, the semiconductor element layer 3 and the support substrate 1 are bonded to each other through the eutectic alloy of a low melting point, whereby bonding at a relatively low temperature is workable. Thus, the p-side electrode 5 itself can be inhibited from alloying, and the p-side electrode 5 and the semiconductor element layer 3 can be inhibited from alloying. Thus, reduction in ohmic property between the p-side electrode 5 and the semiconductor element layer 3 can be suppressed, whereby a light-emitting diode device having a low operating voltage can be obtained. Further, alloying of the p-side electrode can be suppressed, whereby reduction in reflectivity of the p-side electrode 5 can be suppressed. Thus, luminous efficiency of the light-emitting diode device can be improved.

According to the first embodiment, as hereinabove described, the first bonding layer 2a and the third bonding layer 2c having relatively high melting points are provided on the side of the support substrate 1 and on the side of the semiconductor element layer 3 and the second bonding layer 2b having a relatively low melting point is provided between the first bonding layer 2a and the third bonding layer 2c, whereby the support substrate 1 and the semiconductor element layer 3 can be bonded to each other in the state where the second bonding layer 2b is molten while the first bonding layer 2a and the third bonding layer 2c are not molten but softened. Thus, thermal stress caused between the support substrate 1 and the semiconductor element layer 3 and the first, second and third bonding layers 2a, 2b and 2c can be relaxed.

According to the first embodiment, as hereinabove described, the softened first and third bonding layers 2a and 2c and the molten second bonding layer 2b are embedded in the recess portion 12 even when the clearance resulting from the recess portion 12 is present between the support substrate 1 and the semiconductor element layer 3, whereby the bonding area can be increased. Thus, the bonding strength can be improved, whereby separation between the support substrate 1 and the semiconductor element layer 3 can be suppressed, and the separation success rate on the separation layer can be improved when the semiconductor element layer 3 is bonded from the growth substrate 8 to the support substrate 1. Further, the bonding area can be increased, whereby thermal conduction efficiency can be improved dissimilarly to a case where a clearance is formed between the support substrate 1 and the semiconductor element layer 3. Thus, heat radiation in laser application for separating the growth substrate 8 can be homogeneously and efficiently performed. When a clearance is present between the support substrate 1 and the semiconductor element layer 3, therefore, the semiconductor element layer 3 or the p-side electrode 5 can be prevented from cracking resulting from heat stored in the clearance. Thus, the yield of the light-emitting diode device can be improved. Further, heat radiation can be efficiently performed, whereby the light-emitting diode device can be more concentratedly arranged.

According to the first embodiment, as hereinabove described, the third bonding layer 2c is formed on the side surface of the semiconductor element layer 3 through the insulating layer 4, whereby the third bonding layer 2c can be formed on the side surface of the semiconductor element layer 3 while inhibiting a current fed to the semiconductor element layer 3 from leaking to the third bonding layer 2c formed on the side surface of the semiconductor element layer 3. Thus, heat can be released from the side surface of the semiconductor element layer 3 by providing the third bonding layer 2c also on the side surface of the semiconductor element layer 3, dissimilarly to a case where the third bonding layer 2c is not provided on the side surface of the semiconductor element layer 3. Thus, thermal stress caused between the support substrate 1 and the semiconductor element layer 3 and the first, second and third bonding layers 2a, 2b and 2c can be effectively relaxed.

According to the first embodiment, as hereinabove described, the first bonding layer 2a, the second bonding layer 2b and the third bonding layer 2c are prepared from the Au—Sn20 alloy, the Au—Sn90 alloy and the Au—Sn20 alloy respectively, whereby the support substrate 1 and the semiconductor element layer 3 can be bonded to each other by heating the same at a relatively low temperature due to the AU—Sn90 alloy having a low melting point.

Second Embodiment

Figure 9:
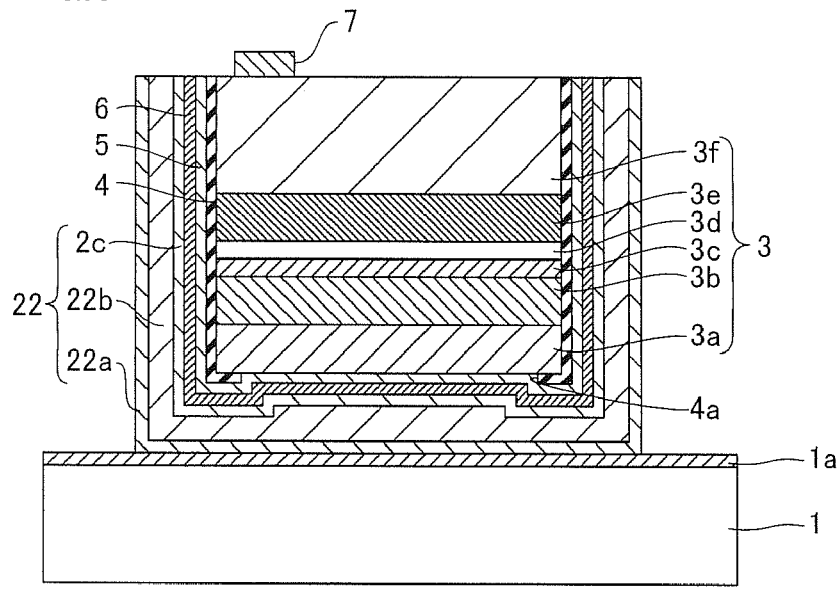
FIG. 9 A sectional view for illustrating the structure of a light-emitting diode device according to a second embodiment of the present invention.

Referring to FIG. 9, a case of forming a first bonding layer 22a, a second bonding layer 22b and a third bonding layer 2c on a semiconductor element layer 3 and bonding the semiconductor element layer 3 and a support substrate 1 to each other through the first bonding layer 22a, the second bonding layer 22b and the third bonding layer 2c formed on the semiconductor element layer 3 dissimilarly to the aforementioned first embodiment is described in this second embodiment. Structures similar to those shown in FIG. 1 are denoted by the same reference numerals, and redundant description is omitted.

In a light-emitting diode device according to the second embodiment, the GaN-based semiconductor element layer 3 is formed on the support substrate 1 through a bonding layer 22, as shown in FIG. 9.

The bonding layer 22 formed between an ohmic layer 1a and a barrier layer 6 is constituted of the first bonding layer 22a of Au—Sn20 having a thickness of about 1 μm formed on the ohmic layer 1a, the second bonding layer 22b of Au—Sn90 having a thickness of about 3 μm formed on the first bonding layer 22a and the third bonding layer 2c of Au—Sn20 having a thickness of about 1 μm formed on the second bonding layer 22b. These third, second and first bonding layers 2c, 22b and 22a are stacked in this order also on the side surface of the semiconductor element layer 3 through an insulating layer 4, a p-side electrode and the barrier layer 6. The remaining structure is similar to the aforementioned first embodiment. The first bonding layer 22a and the second bonding layer 22b are examples of the "first eutectic alloy layer" and the "second eutectic alloy layer" in the present invention respectively.

A manufacturing process for the light-emitting diode device according to the second embodiment of the present invention is described with reference to FIGS. 9 to 12. The structure and the process similar to those of the aforementioned first embodiment shown in FIGS. 2 to 8 are denoted by the same reference numerals, and redundant description is omitted.

Figure 10:
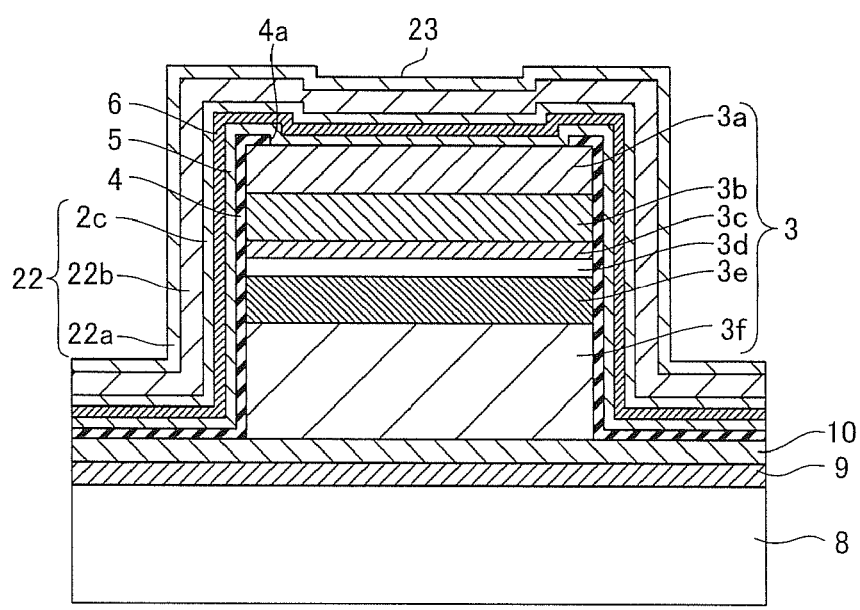
FIG. 10 A sectional view for illustrating a manufacturing process for the light-emitting diode device according to the second embodiment.

First, the third bonding layer 2c of Au—Sn20, the second bonding layer 22b of Au—Sn90 having the thickness of about 3 μm and the first bonding layer 22a are formed in this order on the upper surface and the side surface of the barrier layer 6 formed on the upper surface and the side surface of the semiconductor element layer 3 and a growth substrate 8 through a process similar to that shown in FIGS. 2 to 5, as shown in FIG. 10. A recess portion 23 is formed on the upper surface of the first bonding layer 22a, due to a step of an opening 4a.

Figure 11:
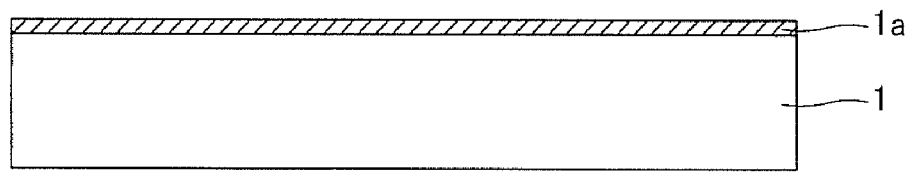
FIG. 11 A sectional view for illustrating the manufacturing process for the light-emitting diode device according to the second embodiment.

Then, an Ni layer and an Au layer having the aforementioned thicknesses respectively are formed in this order on the support substrate 1 by vacuum evaporation, thereby forming the ohmic layer 1a, as shown in FIG. 11.

Figure 12:
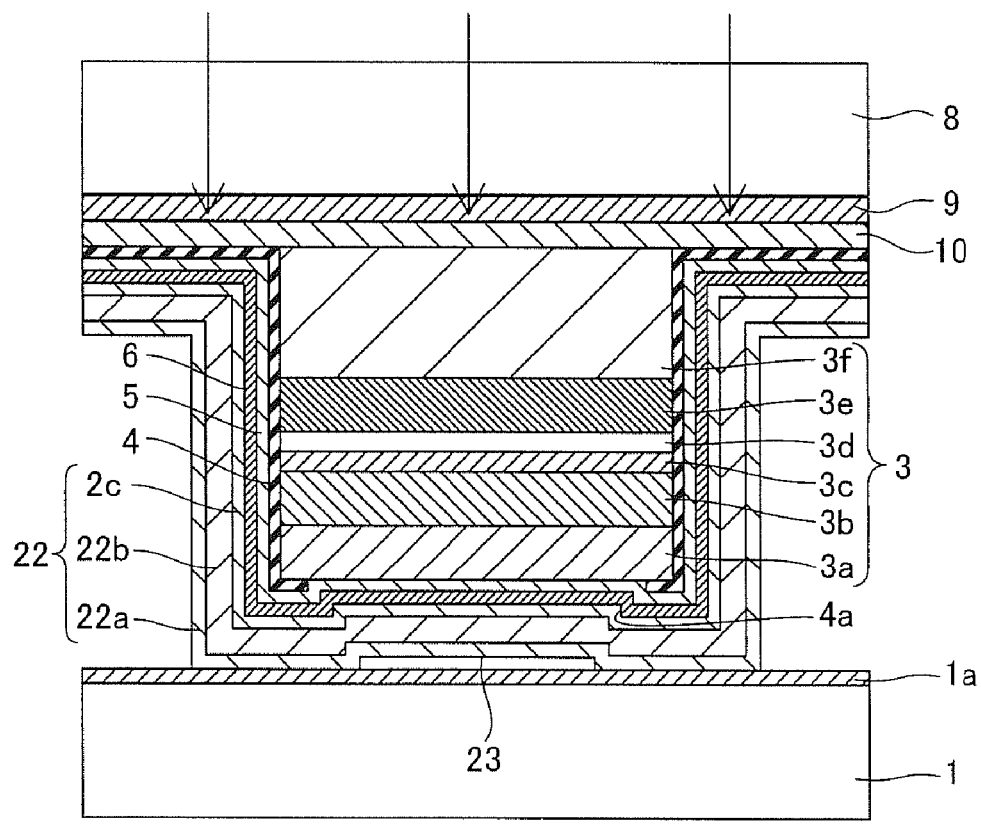
FIG. 12 A sectional view for illustrating the manufacturing process for the light-emitting diode device according to the second embodiment.

Then, the growth substrate 8 is arranged on the support substrate 1 to oppose the first bonding layer 22a and the ohmic layer 1a to each other, as shown in FIG. 12. At this time, a clearance is formed between the first bonding layer 22a and the ohmic layer 1a, due to the recess portion 23 on the upper surface of the first bonding layer 22a. Then, the support substrate 1 and the growth substrate 8 are heated/compression-bonded for about 15 minutes under conditions of about 255° C. and about 100 N/cm². Thus, the first bonding layer 22a and the ohmic layer 1a are bonded to each other. At this time, the second bonding layer 22b is molten while the first bonding layer 22a and the third bonding layer 2c are softened and deformed due to the aforementioned heating/compression bonding, whereby the bonding layer 22 consisting of the first bonding layer 22a, the second bonding layer 22b and the third bonding layer 2c is filled into the clearance resulting from the recess portion 23. Thereafter a YAG second harmonic laser (wavelength: 532 nm) is applied from the side of the growth substrate 8 toward a separation layer 10 as shown by arrows in the figure, thereby prompting thermal decomposition of the separation layer 10 and removing the growth substrate 8, the buffer layer 9 and the separation layer 10.

Then, the upper surface of an n-type contact layer 3f is polished for removing the separation layer 10 etc. remaining on the surface, and an n-side electrode 7 is formed on the n-type contact layer 3f, as shown in FIG. 9. Finally, scribing lines are formed on the lower surface (surface to which the semiconductor element layer 3 is not bonded) by dicing, and the support substrate 1 is divided into every semiconductor element layer 3 bonded to the support substrate 1 along the scribing lines. Thus, the light-emitting diode device according to the second embodiment of the present invention is formed.

According to the second embodiment, as hereinabove described, the support substrate 1 and the semiconductor element layer 3 can be easily bonded to each other by forming the third bonding layer 2c, the second bonding layer 22b and the first bonding layer 22a in this order on the semiconductor element layer 3 and heating the support substrate 1 and the semiconductor element layer 3 in the state arranging the first bonding layer 22a on the support substrate 1.

The remaining effects of the second embodiment are similar to those of the aforementioned first embodiment.

Third Embodiment

In this third embodiment, an example employing semiconductor light-emitting devices according to the aforementioned first embodiment for light-emitting portions of an illuminator is described.

Figure 13:
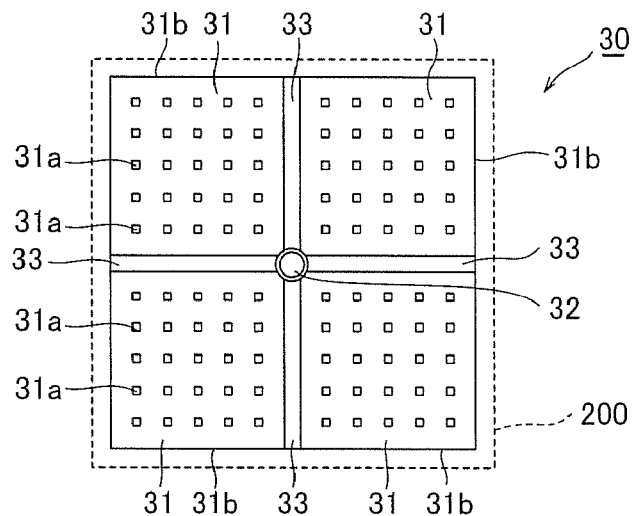
FIG. 13 A plan view showing an illuminator according to a third embodiment of the present invention.

As shown in FIG. 13, an illuminator 30 according to the third embodiment comprises a plurality of panel-shaped light source portions 31, a power supply portion 32 supplying power to the light source portions 31 and coupling members 33 coupling the plurality of light source portions 31 with each other. The plurality of light source portions 31 are coupled with each other by the coupling members 33 around the power supply portion 32, and mounted on a ceiling 200.

Each light source portion 31 includes a plurality of light-emitting units 31a and a panel member 31b. The panel member 31b is made of hardening resin. More specifically, the panel member 31b is made of acrylic, methacryl styrene or ABS (acrylonitrile butadiene styrene). In the panel member 31b, further, the vertical width and the horizontal width are about 1 m respectively, for example. The light-emitting units 31a are arranged in the form of a matrix along the overall surface of the panel member 31b. Referring to FIG. 13, 25 light-emitting units 31a are arranged on one light source portion 31 at regular intervals in the form of a matrix. These light-emitting units 31a emit light through power from the power supply portion 32.

Figure 14:
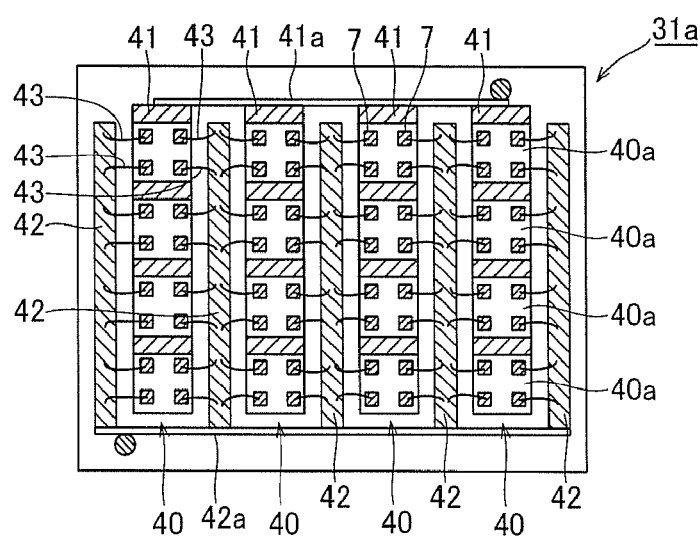
FIG. 14 A plan view showing a light-emitting unit of the illuminator according to the third embodiment.

As shown in FIG. 14, each light-emitting unit 31a includes four packages 40, anode wires 41 so formed as to extend under the respective packages 40 and cathode wires 42 so formed as to extend along both sides of the respective packages 40.

Figure 15:
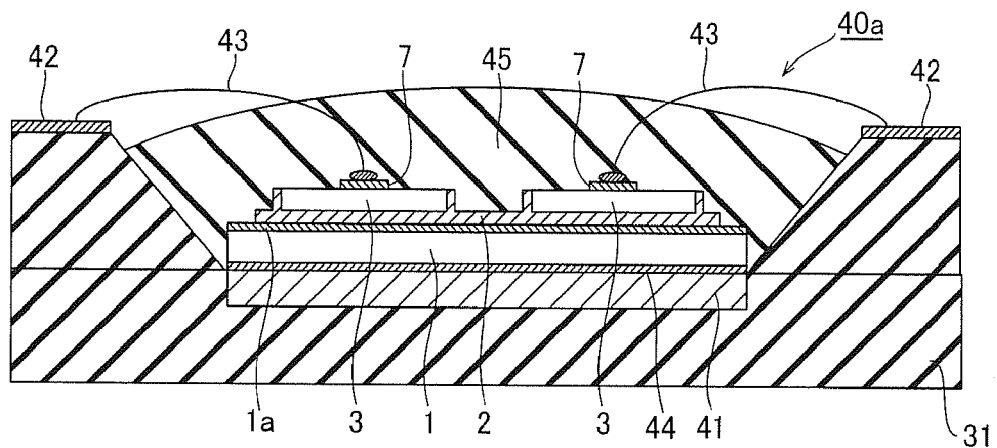
FIG. 15 A sectional view showing a cell of the illuminator according to the third embodiment.

Each package 40 includes four cells 40a. Further, four light-emitting diode devices according to the aforementioned first embodiment are assembled into each cell 40a. In other words, each cell 40a includes one support substrate 1, a bonding layer 2 consisting of the first bonding layer 2a, the second bonding layer 2b and the third bonding layer 3c according to the aforementioned first embodiment provided on the support substrate 1 and four semiconductor element layers 3 bonded to the support substrate 1 through the bonding layer 2, as shown in FIG. 15. N-side electrodes 7 formed on the surfaces of the respective semiconductor element layers 3 and the cathode wires 42 so formed as to extend on both sides of the cell 40a are electrically connected with each other by bonding wires 43. As shown in FIG. 15, the support substrate 1 of each cell 40a is electrically connected with the anode wire 41 by solder 44 or the like. Resin 45 emitting white light by light from the light-emitting diode devices is provided on the cell 40a to cover the light-emitting diode devices.

The plurality of cathode wires 42 in each light-emitting unit 31a are electrically connected with each other by a wire 42a. The plurality of anode wires 41 in each light-emitting unit 31a are also electrically connected with each other by a wire 41a. Further, the cathode wires 42 of each light-emitting unit 31 are electrically connected with the cathode wires 42 of the remaining light-emitting units 31a by unillustrated wires. Similarly, the anode wires 41 of each light-emitting unit 31a are electrically connected with the anode wires 41 of the remaining light-emitting units 31a by unillustrated wires. Thus, the plurality of light-emitting units 31a of the illuminator 30 are electrically connected with each other.

According to the third embodiment, as hereinabove described, the light-emitting diode devices according to the aforementioned first embodiment are so employed that illumination can be performed by making the light-emitting diode devices having a low operating voltage according to the aforementioned first embodiment emit light. Thus, an illuminator 30 having small power consumption and high energy efficiency can be obtained.

A comparative experiment conducted in order to confirm the effects of the aforementioned embodiments is now described.

In this comparative experiment, a light-emitting diode device according to the aforementioned first embodiment was prepared as Example 1. A light-emitting diode device according to the aforementioned second embodiment was prepared as Example 2. A light-emitting diode device prepared similarly to Example 2 (second embodiment) except that a bonding temperature for a support substrate 1 and a growth substrate 8 was about 295° C. was employed as Example 3. In the case of this Example 3, not only a second bonding layer 22b but also a first bonding layer 22a and a third bonding layer 2c were molten by the aforementioned heating/compression bonding.

As comparative example 1, a light-emitting diode device was prepared similarly to Example 2 (second embodiment), except that a bonding layer consisting of a single layer of Au—Sn20 was employed. As comparative example 2, a light-emitting diode device was prepared similarly to comparative example 1, except that a support substrate 1 and a growth substrate 8 were bonded to each other at about 295° C.

(Characteristic Evaluation 1)

Then, the light-emitting diode devices according to the aforementioned Examples 1 to 3 and comparative examples 1 and 2 were evaluated as follows:

"Adhesive force" of bonding layers was evaluated through the rates (separation success rates) of samples in which growth substrates were separable through separation layers without separation of the bonding layers when removed from the semiconductor element layers. More specifically, ⊚, ○, Δ and X denote separation success rates of at least 90%, less than 90% and at least 60%, less than 60% and at least 30%, and less than 30% respectively. As to presence/absence of "crack" on p-side electrodes, the p-side electrodes of the light-emitting diode devices prepared by performing separation through the separation layers as described above were observed with an optical microscope. X and ○ denote cases where cracks were observed and not observed respectively. "Operating voltage" was evaluated through operating voltages observed when feeding a direct current of 20 mA to the light-emitting diode devices. More specifically, ○, Δ and X denote cases where the operating voltages were not more 4.0 V, not more than 4.5 V and in excess of 4.5 V respectively. The following Table 2 shows the results.

TABLE 2

|  | Adhesive Force | Crack | Operating Voltage |
|---|---|---|---|
| Example 1 | Δ | ○ | ○ |
| Example 2 | ○ | ○ | ○ |
| Example 3 | ⊚ | ○ | Δ |
| Comparative Example 1 | X | X | X |
| Comparative Example 2 | Δ | X | Δ |

As shown in Table 2, it is understood that the bonding strength (adhesive force) between the support substrates and the semiconductor element layers in the light-emitting diode devices according to Examples 1 to 3 is large as compared with the light-emitting diode devices according to comparative examples 1 and 2. In the light-emitting diode devices according to Examples 1 to 3, the p-side electrodes were not cracked, whereby it is conceivable that thermal stress was sufficiently relaxed and heat radiation in laser application was also homogeneously performed. Further, the operating voltages of the light-emitting diode devices according to Examples 1 and 2 are smaller than the operating voltages in Example 3 and comparative examples 1 and 2. In Example 3, it is conceivable that the operating voltage increased since the bonding temperature was relatively high.

In comparative example 1, it is conceivable that the operating voltage increased since the bonding strength (adhesive force) was small. In comparative example 2, the adhesive force was improved by increase of the bonding temperature, while it was proved that the p-side electrode was cracked and the operating voltage also increased.

Another comparative experiment in a case of changing materials for bonding layers is now described.

Figure 16:
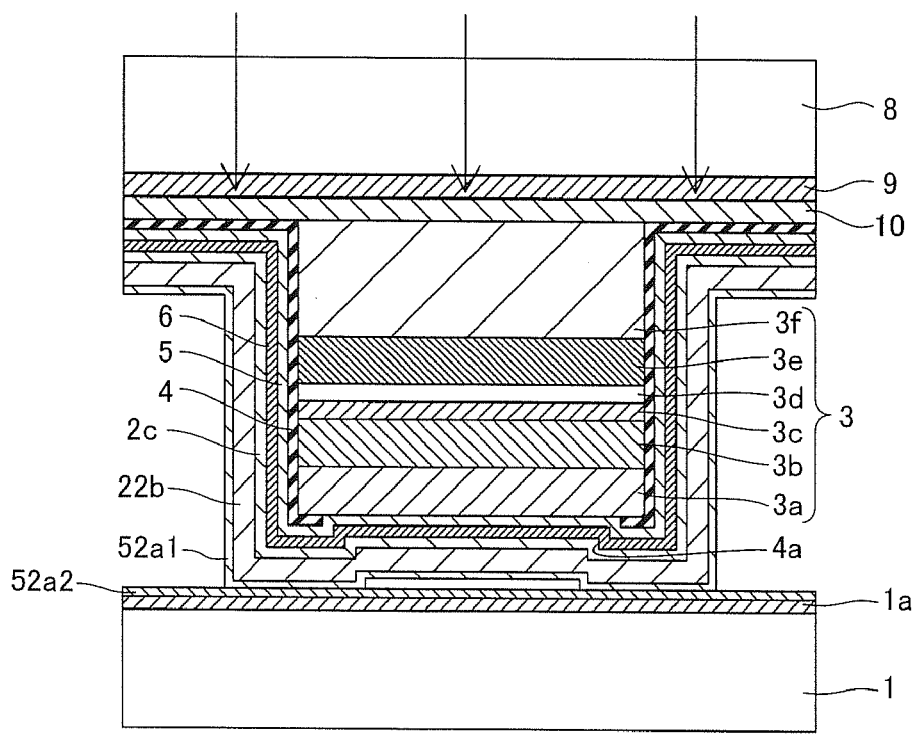
FIG. 16 A sectional view for illustrating a manufacturing process for a light-emitting diode device according to Example 6.
Figure 17:
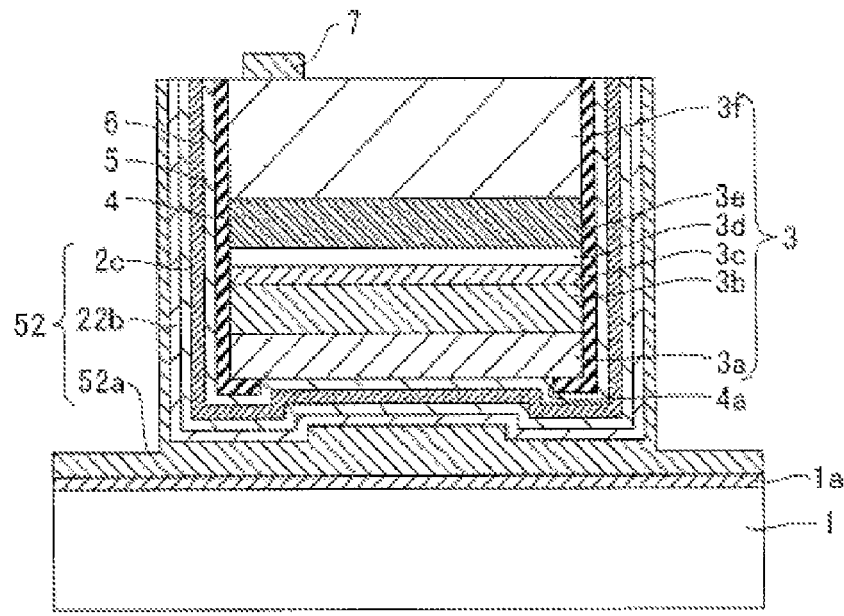
FIG. 17 A sectional view showing the light-emitting diode device according to Example 6.
Figure 18:
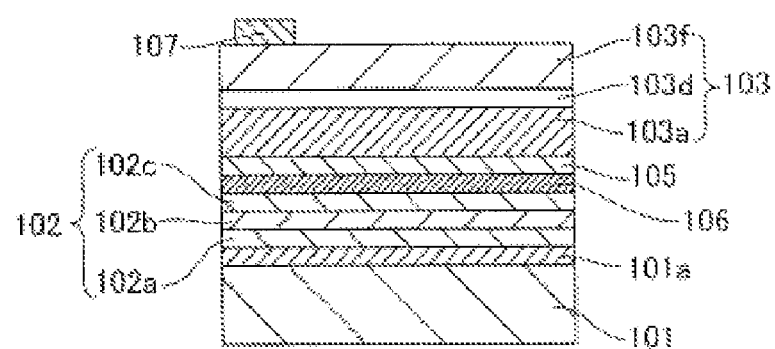
FIG. 18 A sectional view for illustrating the structure of a conventional light-emitting diode device.
Figure 19:
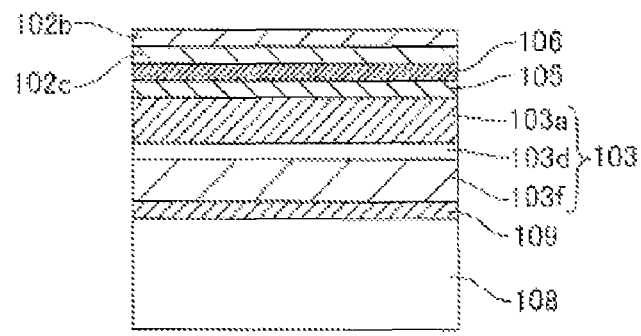
FIG. 19 A sectional view for illustrating a manufacturing process for the conventional light-emitting diode device.
Figure 20:
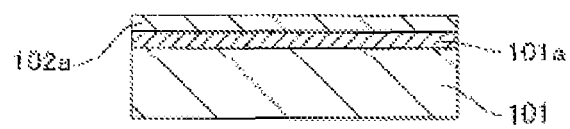
FIG. 20 A sectional view for illustrating the manufacturing process for the conventional light-emitting diode device.
Figure 21:
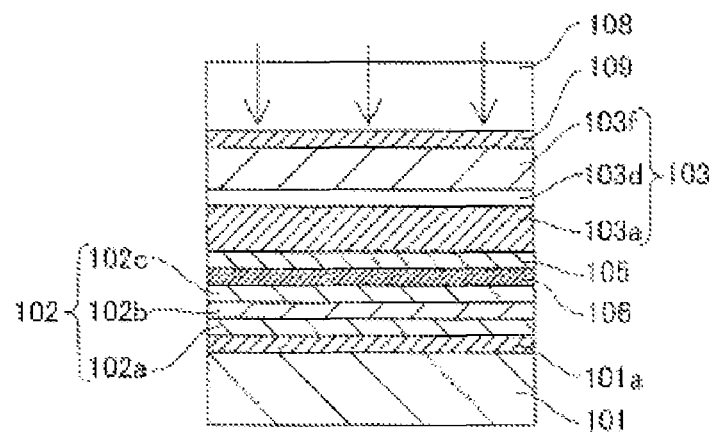
FIG. 21 A sectional view for illustrating the manufacturing process for the conventional light-emitting diode device.

In this comparative experiment, a light-emitting diode device was prepared as Example 4 similarly to Example 1, except that a first bonding layer 2a and a third bonding layer 2c of an Au—Ge alloy (Ge content: about 12 mass %, melting point: about 356° C., thermal expansion coefficient: about $12.0 \times 10^{-6}$/K) (hereinafter referred to as Au—Ge12) were employed and that a support substrate 1 and a growth substrate 8 were bonded to each other at about 295° C. In Example 5, a light-emitting diode device was prepared similarly to Example 2, except that a first bonding layer 22a and a third bonding layer 2c of Au—Ge 12 were employed and that a support substrate 1 and a growth substrate 8 were bonded to each other at about 295° C. In Example 6, a light-emitting diode device was prepared similarly to Example 5, except that a part (sixth bonding layer 52a1 of Au—Ge12) of a bonded first bonding layer 52a was formed on the second bonding layer 22b (see FIG. 10) of Example 5 (second embodiment) with a thickness of 1.0 μm, another part (seventh bonding layer 52a2 of Au—Ge12) of the bonded first bonding layer 52a was formed on a support substrate 1 with a thickness of 0.5 μm and that the sixth bonding layer 52a1 and the seventh bonding layer 52a2 were bonded to each other, as shown in FIG. 16. Thus, the support substrate 1 and a semiconductor element layer 3 were bonded to each other through a bonding layer 52 consisting of the first bonding layer 52a in which a third bonding layer 2c, a second bonding layer 22b as well as the sixth bonding layer 52a1 and the seventh bonding layer 52a2 were softened and integrated with each other in the light-emitting diode device according to Example 6, as shown in FIG. 17. In these Examples 4 to 6, the thermal expansion coefficients of the second bonding layers are larger than the thermal expansion coefficients of the first bonding layers and the third bonding layers.

As comparative example 3, a light-emitting diode device was prepared similarly to Example 5, except that a bonding layer consisting of a single layer of Au—Ge12 was employed. As comparative example 4, a light-emitting diode device was prepared similarly to comparative example 3, except that a support substrate 1 and a growth substrate 8 were bonded to each other at about 375° C.

(Characteristic Evaluation 2)

Then, the light-emitting diode devices prepared according to Examples 4 to 6 and comparative examples 3 and 4 were evaluated similarly to characteristic evaluation 1. The following Table 3 shows the results.

TABLE 3

|  | Adhesive Force | Crack | Operating Voltage |
|---|---|---|---|
| Example 4 | ◎ | ○ | Δ |
| Example 5 | ◎ | ○ | Δ |
| Example 6 | ◎ | ○ | Δ |
| Comparative Example 3 | ○ | X | Δ |
| Comparative Example 4 | ◎ | ○ | X |

As shown in Table 3, it is understood that the bonding strength between the support substrates and the semiconductor element layers in the light-emitting diode devices according to Examples 4 to 6 is large as compared with the light-emitting diodes according to comparative examples 3 and 4. The bonding strength between the support substrate and the semiconductor element layer in the light-emitting diode device according to Example 6 was most excellent as compared with the bonding strength of Examples 1 to 5. In the light-emitting diode devices according to Examples 4 to 6, the p-side electrodes were not cracked, whereby it is conceivable that thermal stress was sufficiently relaxed and heat radiation in laser application was also homogeneously performed. Further, it is understood that the operating voltages increased in the light-emitting diode devices according to Examples 4 to 6 since the bonding temperatures were high as compared with Examples 1 and 2, while these operating voltages are smaller than the operating voltage in comparative example 4.

The adhesive force was further improved in Examples 4 to 6 as compared with the evaluation of Examples 1 to 3, and it can be said that Au—Ge12 is preferable to Au—Sn20 as the material for the first bonding layer and the third bonding layer.

The embodiments and Examples disclosed this time must be considered as illustrative in all points and not restrictive. The range of the present invention is shown not by the above description of the embodiments and Examples but by the scope of claims for patent, and all modifications within the meaning and range equivalent to the scope of claims for patent are included.

For example, while the case of employing the second bonding layer of Au—Sn90 has been shown in each of the aforementioned embodiments and Examples, the present invention is not restricted to this but a second bonding layer of Au—Sn20 may alternatively be employed. In this case, Au—Ge12 can be employed for the first bonding layer and the third bonding layer, for example. Thus, other materials may be employed for the first bonding layer, the second bonding layer and the third bonding layer if the melting point of the alloy constituting the second bonding layer is rendered lower than the melting points of the alloys constituting the first bonding layer and the third bonding layer, while the same preferably contain at least any one of an Au—Sn alloy, an Au—Ge alloy and an Au—Si alloy.

While the case of employing the same material for the first bonding layer and the third bonding layer has been shown in each of the aforementioned embodiments and Examples, the present invention is not restricted to this but the materials may alternatively be selected to differ from each other in response to the composition(s) and the thermal characteristic(s) such as the thermal expansion coefficient(s) of the support substrate and the semiconductor element layer or the p-side electrode respectively.

While the example of forming the bonding layer by the three layers of the first bonding layer, the second bonding layer and the third bonding layer has been shown in each of the aforementioned embodiments and Examples, the present invention is not restricted to this but the bonding layer may alternatively include a larger number of alloy layers.

While the example of arranging the fourth bonding layer and the fifth bonding layer for forming the second bonding layer to be opposed to each other and performing heating/compression bonding, arranging the sixth bonding layer and the seventh bonding layer for forming the first bonding layer to be opposed to each other and performing bonding or arranging the first bonding layer and the support substrate to be opposed to each other has been shown in each of the aforementioned embodiments and Examples, the present invention is not restricted to this but the bonding layer can be separated along arbitrary sectional surfaces constituting the same so that the respective surfaces are formed on the side of the semiconductor element layer and on the side of the support substrate. In this case, the support substrate and the semiconductor element layer can be bonded to each other by arranging the separated surfaces to be opposed to each other and thereafter heating/compression-bonding the same.

While the example of removing the growth substrate after bonding between the support substrate and the semiconductor element layer has been shown in each of the aforementioned embodiments and Examples, the present invention is not restricted to this but the growth substrate may alternatively be left on the semiconductor element layer.

While the example of forming the GaN-based semiconductor layer has been shown in each of the aforementioned embodiments and Examples, the present invention is not restricted to this but a semiconductor element layer consisting of another semiconductor material such as AlGaInP, for example, may alternatively be employed. Also as to the p-side electrode, the barrier layer and the n-side electrode, other materials and other structures may be properly selected.

The invention claimed is:

1. A semiconductor light-emitting device comprising:
   a support substrate (1);
   a first eutectic alloy layer (2a) formed on said support substrate;
   a second eutectic alloy layer (2b) formed on said first eutectic alloy layer;
   a third eutectic alloy layer (2c) formed on said second eutectic alloy layer; and
   a semiconductor element layer (3) including an emission layer (3d) formed on said third eutectic alloy layer, wherein
   the melting point of said second eutectic alloy layer is lower than the melting points of said first eutectic alloy layer and said third eutectic alloy layer, and
   said third eutectic alloy layer is formed on the side surface of said semiconductor element layer through an insulating layer (4).

2. The semiconductor light-emitting device according to claim 1, wherein
   the thermal expansion coefficient of said second eutectic alloy layer is larger than the thermal expansion coefficients of said first eutectic alloy layer and said third eutectic alloy layer.

3. The semiconductor light-emitting device according to claim 1, wherein
   said first eutectic alloy layer, said second eutectic alloy layer and said third eutectic alloy layer contain at least any of an Au—Sn alloy, an Au—Ge alloy and an Au—Si alloy respectively.

4. The semiconductor light-emitting device according to claim 3, wherein
said first eutectic alloy layer, said second eutectic alloy layer and said third eutectic alloy layer consist of the Au—Sn alloy, and
the content of Sn in said second eutectic alloy layer is larger than the contents of Sn in said first eutectic alloy layer and said third eutectic alloy layer.

5. The semiconductor light-emitting device according to claim 3, wherein said first eutectic alloy layer and said third eutectic alloy layer consist of the Au—Ge alloy, and said second eutectic alloy layer consists of the Au—Sn alloy.

6. An illuminator comprising a semiconductor light-emitting device including:
a support substrate (1);
a first eutectic alloy layer (2a) formed on said support substrate;
a second eutectic alloy layer (2b) formed on said first eutectic alloy layer;
a third eutectic alloy layer (2c) formed on said second eutectic alloy layer; and
a semiconductor element layer (3) including an emission layer (3d) formed on said third eutectic alloy layer, wherein
the melting point of said second eutectic alloy layer is lower than the melting points of said first eutectic alloy layer and said third eutectic alloy layer, and
said third eutectic alloy layer is formed on the side surface of said semiconductor element layer through an insulating layer (4).

7. The illuminator according to claim 6, wherein
the thermal expansion coefficient of said second eutectic alloy layer is larger than the thermal expansion coefficients of said first eutectic alloy layer and said third eutectic alloy layer.

8. The illuminator according to claim 6, wherein
said first eutectic alloy layer, said second eutectic alloy layer and said third eutectic alloy layer contain at least any of an Au—Sn alloy, an Au—Ge alloy and an Au—Si alloy respectively.

9. A method of manufacturing a semiconductor light-emitting device, comprising steps of:
forming a semiconductor element layer (3) including an emission layer (3d);
arranging, between a support substrate (1) and said semiconductor element layer, a first eutectic alloy layer (2a), a second eutectic alloy layer (2b) and a third eutectic alloy layer (2c) in this order from the side of said support substrate; and
bonding said semiconductor element layer and said support substrate to each other through said first eutectic alloy layer, said second eutectic alloy layer and said third eutectic alloy layer by heating the same, wherein
the melting point of said second eutectic alloy layer is lower than the melting points of said first eutectic alloy layer and said third eutectic alloy layer, and
a heating temperature in the step of bonding said semiconductor element layer and said support substrate to each other is at least the melting point of said second eutectic alloy layer and less than the melting points of said first eutectic alloy layer and said third eutectic alloy layer, and the step of arranging said first eutectic alloy layer, said second eutectic alloy layer and said third eutectic alloy layer includes a step of forming said third eutectic alloy layer on the side surface of said semiconductor element layer through an insulating layer.

10. The method of manufacturing a semiconductor light-emitting device according to claim 9, wherein
the step of arranging said first eutectic alloy layer, said second eutectic alloy layer and said third eutectic alloy layer includes steps of:
forming said third eutectic alloy layer, said second eutectic alloy layer and said first eutectic alloy layer in this order on said semiconductor element layer, and
arranging said support substrate on said first eutectic alloy layer.

11. The method of manufacturing a semiconductor light-emitting device according to claim 9, wherein
the step of arranging said first eutectic alloy layer, said second eutectic alloy layer and said third eutectic alloy layer includes steps of:
forming said third eutectic alloy layer, said second eutectic alloy layer and a part of said first eutectic alloy layer in this order on said semiconductor element layer,
forming another part of said first eutectic alloy layer on said support substrate, and
arranging the part of said first eutectic alloy layer formed on said support substrate on the part of said first eutectic alloy layer formed on said semiconductor element layer.

12. The method of manufacturing a semiconductor light-emitting device according to claim 9, wherein
the step of forming said semiconductor element layer includes a step of forming said semiconductor element layer on a growth substrate (8),
the method further comprising a step of removing said growth substrate from said semiconductor element layer.

13. The method of manufacturing a semiconductor light-emitting device according to claim 9, wherein
the thermal expansion coefficient of said second eutectic alloy layer is larger than the thermal expansion coefficients of said first eutectic alloy layer and said third eutectic alloy layer.

14. The method of manufacturing a semiconductor light-emitting device according to claim 9, wherein
said first eutectic alloy layer, said second eutectic alloy layer and said third eutectic alloy layer contain at least any of an Au—Sn alloy, an Au—Ge alloy and an Au—Si alloy respectively.

15. The method of manufacturing a semiconductor light-emitting device according to claim 14, wherein
said first eutectic alloy layer, said second eutectic alloy layer and said third eutectic alloy layer consist of the Au—Sn alloy, and
the content of Sn in said second eutectic alloy layer is larger than the contents of Sn in said first eutectic alloy layer and said third eutectic alloy layer.

16. The method of manufacturing a semiconductor light-emitting device according to claim 14, wherein
said first eutectic alloy layer and said third eutectic alloy layer consist of the Au—Ge alloy, and
said second eutectic alloy layer consists of the Au—Sn alloy.

* * * * *